(12) United States Patent
Zhang et al.

(10) Patent No.: US 12,302,558 B2
(45) Date of Patent: May 13, 2025

(54) THREE-DIMENSIONAL MEMORY AND MANUFACTURING METHOD THEREOF

(71) Applicant: YANGTZE MEMORY TECHNOLOGIES CO., LTD., Wuhan (CN)

(72) Inventors: Zhong Zhang, Wuhan (CN); Yuhui Han, Wuhan (CN); Cuicui Kong, Wuhan (CN); Kun Zhang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 638 days.

(21) Appl. No.: 17/559,181

(22) Filed: Dec. 22, 2021

(65) Prior Publication Data

US 2022/0115392 A1    Apr. 14, 2022

Related U.S. Application Data

(63) Continuation of application No. PCT/CN2021/120889, filed on Sep. 27, 2021.

(30) Foreign Application Priority Data

Sep. 29, 2020  (CN) .......................... 202011046857.9

(51) Int. Cl.
*H10B 41/44* (2023.01)
*H10B 41/20* (2023.01)
(Continued)

(52) U.S. Cl.
CPC ............. *H10B 41/44* (2023.02); *H10B 41/20* (2023.02); *H10B 43/10* (2023.02); *H10B 43/20* (2023.02)

(58) Field of Classification Search
CPC ........ H10B 41/44; H10B 41/20; H10B 41/27; H10B 41/10; H10B 43/10; H10B 43/20; H10B 43/27
See application file for complete search history.

(56) References Cited

U.S. PATENT DOCUMENTS 10,720,445 B1 *  7/2020  Shimizu .............. H01L 23/5226
2016/0268287 A1   9/2016  Park et al.
(Continued)

FOREIGN PATENT DOCUMENTS

CN  106920794 A  7/2017
CN  107706186 A  2/2018
(Continued)

OTHER PUBLICATIONS

International Search Report issued in corresponding International Application No. PCT/CN2021/120889 mailed Dec. 17, 2021, 4 pages.

*Primary Examiner* — Syed I Gheyas
*Assistant Examiner* — Casey Paul Boatman
(74) *Attorney, Agent, or Firm* — BAYES PLLC (57) ABSTRACT

A three-dimensional memory includes a stack structure, a dummy structure and a gate line slit. The stack structure includes gate line layers and isolation layers stacked alternatively in the vertical direction. The dummy structure includes a first dummy section and a second dummy section. The gate line slit has one end extending into a gap formed by at least one of the first dummy section or the second dummy section. At least one of the first dummy section and the second dummy section partially overlaps a projection of the gate line slit onto the horizontal plane to realize connection between the dummy structure and the gate line slit.

20 Claims, 5 Drawing Sheets

(51) Int. Cl.
H10B 43/10 (2023.01)
H10B 43/20 (2023.01)

(56) References Cited

U.S. PATENT DOCUMENTS

| | | | |
|---|---|---|---|
| 2020/0098783 A1 | 3/2020 | Ohtori et al. | |
| 2020/0203366 A1 | 6/2020 | Kim et al. | |
| 2021/0167076 A1* | 6/2021 | Xu | H10B 43/10 |

FOREIGN PATENT DOCUMENTS

| | | | | | |
|---|---|---|---|---|---|
| CN | 109346471 A | | 2/2019 | | |
| CN | 109360826 A | | 2/2019 | | |
| CN | 109524295 A | | 3/2019 | | |
| CN | 109690775 A | | 4/2019 | | |
| CN | 109742083 A | | 5/2019 | | |
| CN | 109935596 A | | 6/2019 | | |
| CN | 110112134 A | | 8/2019 | | |
| CN | 110211965 A | | 9/2019 | | |
| CN | 110914990 A | | 3/2020 | | |
| CN | 111052381 A | * | 4/2020 | ..... | H01L 21/823475 |
| CN | 111146209 A | | 5/2020 | | |
| CN | 111341786 A | | 6/2020 | | |
| CN | 111354735 A | | 6/2020 | | |
| CN | 111403398 A | * | 7/2020 | ........ | H01L 27/11565 |
| CN | 111403400 A | | 7/2020 | | |
| CN | 111527605 A | | 8/2020 | | |
| CN | 111540743 A | | 8/2020 | | |
| CN | 111540747 A | | 8/2020 | | |
| CN | 112185967 A | | 1/2021 | | |
| CN | 112466884 A | | 3/2021 | | |
| CN | 112928117 A | | 6/2021 | | |
| CN | 113889478 A | | 1/2022 | | |

* cited by examiner

THREE-DIMENSIONAL MEMORY AND MANUFACTURING METHOD THEREOF

CROSS-REFERENCE TO RELATED APPLICATIONS

This application is a continuation of International Application No. PCT/CN2021/120889, filed on Sep. 27, 2021, which claims the benefit of priority to C.N. Application No. 202011046857.9, filed on Sep. 29, 2020, both of which are hereby incorporated by reference in their entireties.

BACKGROUND

The present disclosure belongs to the technical field of semiconductor integrated circuits, and relates to a three-dimensional memory and manufacturing method thereof.

Significant improvements have been made in semiconductor production process as planar flash memories develop. However, in recent years, the development of planar flash memories has encountered various challenges: the physical limit, the existing developing technology limit and the storage electron density limit, etc. In view of this, in order to address the difficulties encountered in planar flash memories and achieve lower production costs for unit memory cell, various different three-dimensional (3D) flash memory structures emerged such as 3D NOR (3D OR NOT) flash memory and 3D NAND (3D AND NOT) flash memory. Among them, 3D NAND memory has become the dominant process for emerging memory designs and productions based on its features of small volume and large capacity with the design concept of highly integrating memory cells in which memory cells are stacked layer by layer in a three-dimensional manner, so as to allow to produce memories with a high storage density per unit area and efficient memory cell performance.

In a manufacturing process of a 3D memory, gate line slits (GLS) are used to provide etchant application passages for removing sacrificial layers in the stack structure and resulting in lateral grooves, and to provide thin film deposition material passages for depositing conductor layers in the lateral grooves, and gate line slits may be further used to fabricate array common sources (ACS) that may be used to divide the memory array area or staircase connection area into a plurality of smaller areas.

However, when dummy channel holes (dummy CH) connected with the gate line slits (GLS) are to be formed, weak points would occur at the boundary between the gate line slits and dummy channel holes which may reduce the process window for forming gate line slits and result in an increased process difficulty.

SUMMARY

In view of the above disadvantages with prior art, an object of the present disclosure is to provide a 3D memory and manufacturing method thereof that address the reduced process window for forming gate line slits when gate line slits and dummy structures overlap, as in prior art.

In order to achieve the above-mentioned and other relevant objects, the present disclosure provides a 3D memory comprising: a stack structure comprising gate line layers and dielectric layers stacked alternatively in a vertical direction; a dummy structure penetrating through the stack structure in the vertical direction and comprising a first dummy section and a second dummy section; and a gate line slit penetrating through the stack structure in the vertical direction, wherein the gate line slit has one end extending into a gap formed by the first dummy section and/or the second dummy section, at least one of the first dummy section and the second dummy section partially overlaps a projection of the gate line slit onto a horizontal plane.

Optionally, in a direction perpendicular to a direction in which the gate line slit extends, the overlapping part of the dummy structure and the projection of the gate line slit onto the horizontal plane has a width of M, and the gate line slit has a width of N, wherein M<0.1N.

Optionally, the first dummy section and the second dummy section are disposed independently and the gap is between the first dummy section and the second dummy section.

Optionally, the first dummy section and the second dummy section are disposed in parallel in the direction in which the gate line slit extends.

Optionally, the gap is located between the first dummy section and the second dummy section, the dummy structure further comprises a third dummy section located in the gap and connected with the first dummy section and the second dummy section, and the third dummy section is spaced apart from the gate line slit by a preset distance.

Optionally, the gaps are located respectively in a region enclosed by the first dummy section and a region enclosed by the second dummy section, the dummy structure further comprises a third dummy section located between the first dummy section and the second dummy section and connected with the first dummy section and the second dummy section respectively, and the third dummy section is spaced apart from the gate line slit by a preset distance.

Optionally, the gap is located between the first dummy section and the second dummy section, the dummy structure further comprises a third dummy section connected with an end of the first dummy section away from the gate line slit and an end of the second dummy section away from the gate line slit, and the third dummy section is spaced apart from the gate line slit by a preset distance.

Optionally, the 3D memory comprises a plurality of blocks formed by dividing the stack structure by the gate line slit in a first horizontal direction, the blocks comprise a first core region, a step region and a second core region disposed sequentially in a second horizontal direction, and the first horizontal direction is perpendicular to the second horizontal direction.

Optionally, the plurality of blocks comprise adjacent first block and second block, the gate line slit comprises a first gate line slit and a second gate line slit located between the first block and the second block and respectively in the first core region and the second core region, the first gate line slit has an end facing the step region and connected with one of the dummy structures, and the second gate line slit has an end facing the step region and connected with one of the dummy structures.

Optionally, the gap is located between the first dummy section and the second dummy section, the dummy structure further comprises a third dummy section connected with an end of the first dummy section away from the gate line slit and an end of the second dummy section away from the gate line slit, and the third dummy section is spaced apart from the gate line slit by a preset distance.

Optionally, the gate line slit comprises a plurality of third gate line slits spaced apart from each other on a side of the first block away from the second block and a plurality of fourth gate line slits spaced apart from each other on a side of the second block away from the first block, the third gate line slits and the fourth gate line slits are located in the step region, adjacent two of the third gate line slits are connected by the dummy structure, and adjacent two of the fourth gate line slits are connected by the dummy structure.

Optionally, the first dummy section and the second dummy section are disposed independently and the gap is between the first dummy section and the second dummy section; or the gap is located between the first dummy section and the second dummy section, the dummy structure further comprises a third dummy section located in the gap and connected with the first dummy section and the second dummy section, and the third dummy section is spaced apart from the gate line slit by a preset distance; or the gaps are located respectively in a region enclosed by the first dummy section and a region enclosed by the second dummy section, the dummy structure further comprises a third dummy section located between the first dummy section and the second dummy section and connected with the first dummy section and the second dummy section respectively, and the third dummy section is spaced apart from the gate line slit by a preset distance.

Optionally, in an edge region of the first block away from the second block, a first wall structure is provided in the step region; in an edge region of the second block away from the first block, a second wall structure is provided in the step region; the third gate line slit is located on a side of the first wall structure away from the second wall structure; the fourth gate line slit is located on a side of the second wall structure away from the first wall structure; and the first wall structure and the second wall structure each comprise conductive layers and insulating layers stacked alternatively in the vertical direction.

Optionally, the dummy structure comprises an insulating material.

Optionally, the dummy structure has a bottom surface lower than a bottom surface of the gate line slit.

Optionally, a polysilicon layer is further comprised, the stack structure is disposed on the polysilicon layer, and a bottom of the gate line slit extends to at least a surface of the poly silicon layer.

The present disclosure further provides a manufacturing method of a 3D memory comprising steps of providing a substrate and forming a stack structure on the substrate that comprises gate line sacrificial layers and dielectric layers stacked alternatively in a vertical direction; forming a dummy structure penetrating through the stack structure in the vertical direction and comprising a first dummy section and a second dummy section; and forming a gate line slit penetrating through the stack structure in the vertical direction, wherein the gate line slit has one end extending into a gap formed by the first dummy section and/or the second dummy section, at least one of the first dummy section and the second dummy section partially overlaps a projection of the gate line slit onto a horizontal plane.

Optionally, in a direction perpendicular to a direction in which the gate line slit extends, the overlapping part of the dummy structure and the projection of the gate line slit onto the horizontal plane has a width of M, and the gate line slit has a width of N, wherein M<0.1N.

Optionally, the first dummy section and the second dummy section are disposed independently and the gap is between the first dummy section and the second dummy section.

Optionally, the gap is located between the first dummy section and the second dummy section, the dummy structure further comprises a third dummy section located in the gap and connected with the first dummy section and the second dummy section, and the third dummy section is spaced apart from the gate line slit by a preset distance; or the gaps are located respectively in a region enclosed by the first dummy section and a region enclosed by the second dummy section, the dummy structure further comprises a third dummy section located between the first dummy section and the second dummy section and connected with the first dummy section and the second dummy section respectively, and the third dummy section is spaced apart from the gate line slit by a preset distance; or the gap is located between the first dummy section and the second dummy section, the dummy structure further comprises a third dummy section connected with an end of the first dummy section away from the gate line slit and an end of the second dummy section away from the gate line slit, and the third dummy section is spaced apart from the gate line slit by a preset distance.

Optionally, the 3D memory comprises a plurality of blocks formed by dividing the stack structure by the gate line slit in a first horizontal direction, the blocks comprise a first core region, a step region and a second core region disposed sequentially in a second horizontal direction, and the first horizontal direction is perpendicular to the second horizontal direction.

Optionally, the plurality of blocks comprise adjacent first blocks and second blocks, the gate line slit comprises a first gate line slit and a second gate line slit located between the first block and the second block and respectively in the first core region and the second core region, the first gate line slit has an end facing the step region and connected with one of the dummy structures, and the second gate line slit has an end facing the step region and connected with one of the dummy structures.

Optionally, the gap is located between the first dummy section and the second dummy section, the dummy structure further comprises a third dummy section connected with an end of the first dummy section away from the gate line slit and an end of the second dummy section away from the gate line slit, and the third dummy section is spaced apart from the gate line slit by a preset distance.

Optionally, the gate line slit comprises a plurality of third gate line slits spaced apart from each other on a side of the first block away from the second block and a plurality of fourth gate line slits spaced apart from each other on a side of the second block away from the first block, adjacent two of the third gate line slits are connected by the dummy structure, and adjacent two of the fourth gate line slits are connected by the dummy structure.

Optionally, the first dummy section and the second dummy section are disposed independently and the gap is between the first dummy section and the second dummy section; or the gap is located between the first dummy section and the second dummy section, the dummy structure further comprises a third dummy section located in the gap and connected with the first dummy section and the second dummy section, and the third dummy section is spaced apart from the gate line slit by a preset distance; or the gaps are located respectively in a region enclosed by the first dummy section and a region enclosed by the second dummy section, the dummy structure further comprises a third dummy section located between the first dummy section and the second dummy section and connected with the first dummy section and the second dummy section respectively, and the third dummy section is spaced apart from the gate line slit by a preset distance.

Optionally, in an edge region of the first block away from the second block, a first wall structure is provided in the step region; in an edge region of the second block away from the first block, a second wall structure is provided in the step region; the third gate line slit is located on a side of the first wall structure away from the second wall structure; the fourth gate line slit is located on a side of the second wall structure away from the first wall structure; and the first wall structure and the second wall structure each comprise the gate line sacrificial layers and the dielectric layers stacked alternatively in the vertical direction.

Optionally, the substrate comprises a bottom polysilicon layer, a first spacer layer, a middle polysilicon layer, a second spacer layer and a top polysilicon layer sequentially from bottom to top, a bottom of the dummy structure extends at least to a surface of the second spacer layer, and a bottom of the gate line slit extends at least to a surface of the top polysilicon layer.

As described above, in the 3D memory of the present disclosure, the dummy structure comprises a first dummy section and a second dummy section with a gap provided in between, an end of the gate line slit extends into the gap, at least one of the first dummy section and the second dummy section partially overlaps the projection of the gate line slit onto the horizontal plane to achieve a connection between the dummy structure and the gate line slit. This dummy structure design, in which an end of gate line slit is wrapped but not completely overlapped, may effectively improve the process window problem of the etching of gate line slit at the boundary between the dummy structure and the gate line slit, and effectively reduce/eliminate weak points at the boundary between the dummy structure and the gate line slit, thereby facilitating improvement of device reliability.

DETAILED DESCRIPTION

Implementations of the present disclosure will be described below with respect to specific examples, and those skilled in the art can easily understand other advantages and effects of the present disclosure from contents disclosed in this specification. Also, the present disclosure may be implemented or applied by means of additional different implementations, and various details in the specification may be modified or changed in various manners without departing from the spirit of the present disclosure based on different viewpoints and applications.

Please refer to FIGS. 1 to 12. It is to be noted that diagrams provided in the present embodiments simply schematically illustrate basic concepts of the present disclosure, therefore only show relevant elements of the present disclosure and are not drawn according to the numbers, shapes and sizes of elements for practical implementation. During practical implementation, forms, numbers and proportions of elements may be any arbitrary variants and the layouts of elements may be more complicated.

In a 3D memory having memory array regions on two sides and a step connection region in between, in order to prevent structure from collapsing due to too long and too dense gate line slits, a middle part of a gate line slit between two blocks is removed, and silicon nitride/silicon oxide left after removing gate line sacrificial layer (silicon nitride) is used to isolate blocks. But dummy structures are needed at ends of gate line slits to facilitate isolation between blocks. In order to realize reinforcement between all blocks, gate line slits on walls are designed to be discontinued and dummy structures are used to realize isolation between blocks. However, weak points would occur at boundaries between gate line slits and dummy structures. The etching of gate line slits needs to be stopped on the top polysilicon layer, however, due to the inconsistent etch rates caused by material difference, the dummy structures "eat" some polysilicon at the boundaries between gate line slits and dummy structures, which reduces a process window for stopping etching of the gate line slits on polysilicon. Accordingly, the present disclosure alleviates the above-mentioned problem by a novel dummy structure design that is specifically described with reference to the following embodiments.

Embodiment I

Figure 1:
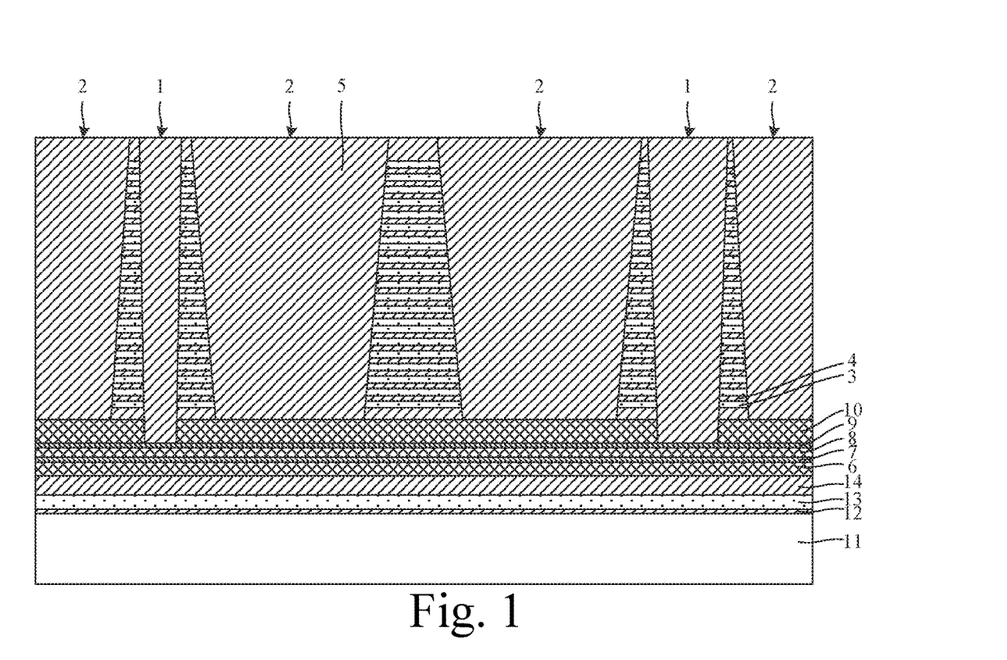
FIG. 1 is a sectional view of a 3D memory according to the present disclosure.

The present embodiment provides a 3D memory. Referring to FIG. 1, a sectional view of the 3D memory is shown, which comprises a stack structure, a dummy structure 1 and a gate line slit 2, wherein the stack structure comprises gate line layers 3 and isolation layers 4 stacked alternatively in a vertical direction, and both the dummy structure 1 and the gate line slit 2 penetrate through the stack structure in the vertical direction.

As an example, the gate line layers 3 comprise, but not limited to tungsten layers, the isolation layers 4 comprise, but not limited to silicon oxide layers, and the dummy structure 1 and the gate line slit are both filled with insulating material 5.

As an example, the 3D memory further comprises a polysilicon layer on which the stack structure is disposed, and a bottom of the gate line slit 2 extends to at least a surface of the polysilicon layer. In the present embodiment, the polysilicon layer comprises a bottom polysilicon layer 6, a first spacer layer 7, a middle polysilicon layer 8, a second spacer layer 9 and a top polysilicon layer 10 sequentially from bottom to top. Bottoms of the gate line slit 2 and the dummy structure 1 are higher than the top surface of the middle polysilicon layer 8. In the present embodiment, the bottom of the gate line slit 2 reaches the surface of the top polysilicon layer 10, the bottom of the dummy structure 1 is lower than the bottom of the gate line slit 2 and reaches the surface of the second spacer layer 9, and the first spacer layer 7 or the second spacer layer 9 comprise, but not limited to silicon oxynitride.

As an example, under the polysilicon layer, there are further provided sequentially from bottom to top a substrate layer 11, a protective layer 12, a silicon nitride layer 13, and a silicon oxide layer 14. The substrate layer 11 comprises, but not limited to Si substrate, Ge substrate, SiGe substrate, silicon on insulator (SOI) substrate or germanium on insulator (GOI) substrate, and the substrate layer 11 may be P-doped or N-doped. The protective layer 12 comprises, but not limited to silicon oxide.

It is noted that the example above is merely illustrative, but in other embodiments, structure layers under the stack structure may be adjusted as desired, and the example above should not unduly limit the scope of the present disclosure.

Figure 2:
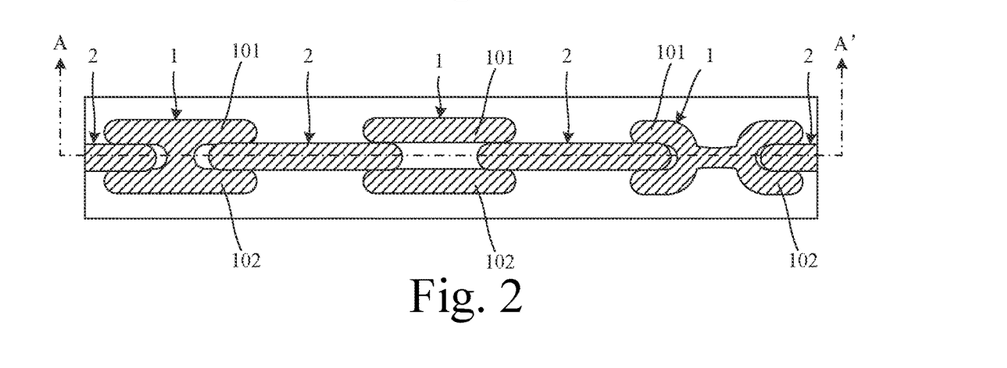
FIG. 2 is a partial top view of a 3D memory according to the present disclosure.

As an example, referring to FIG. 2, a partial top view of the 3D memory is shown, wherein the previous FIG. 1 shows a section along A-A' in FIG. 2.

In particular, as shown in FIG. 2, the dummy structure 1 comprises a first dummy section 101 and a second dummy section 102, the gate line slit 2 has one end extending into a gap formed by the first dummy section 101 and/or the second dummy section 102, and at least one of the first dummy section 101 and the second dummy section 102 partially overlaps the projection of the gate line slit 2 onto the horizontal plane.

In particular, the gap formed by the first dummy section 101 and/or the second dummy section 102 has a width smaller than the width of the gate line slit 2 to ensure that the dummy structure 1 and the projection of the gate line slit 2 onto the horizontal plane have overlapping parts, thereby realizing connection between the dummy structure 1 and the gate line slit 2. Ideally, the gate line slit 2 is located right in the middle of the gap formed by the first dummy section 101 and the second dummy section 102, and both the first dummy section 101 and the second dummy section 102 have overlapping parts with the projection of the gate line slit 2 onto the horizontal plane; or the gate line slit 2 is located right in the middle of the gap formed by the first dummy section 101 or the second dummy section 102, and the first dummy section 101 or the second dummy section 102 has overlapping parts with both sides of the gate line slit 2; while in non-ideal situation, the gate line slit 2 is offset from the right middle of the gap, however since the gap width is smaller than that of the gate line slit 2, regardless of which side the gate line slit 2 is offset, it is possible to ensure that the dummy structure 1 and the projection of the gate line slit 2 onto the horizontal plane have overlapping parts.

As an example, in a direction perpendicular to a direction in which the gate line slit 2 extends, the overlapping part of the dummy structure 1 and the projection of the gate line slit 2 onto the horizontal plane has a width of M, and the gate line slit 2 has a width of N, wherein M<0.1N. That is, the width of the overlapping part occupies a very small proportion of the total width of the gate line slit 2, thereby effectively reducing/eliminating weak points at boundaries between the dummy structure 1 and the gate line slit 2 and facilitating improvement of device reliability.

In particular, the dummy structure 1 may have various forms given that the above-described principles are satisfied.

Figure 3:
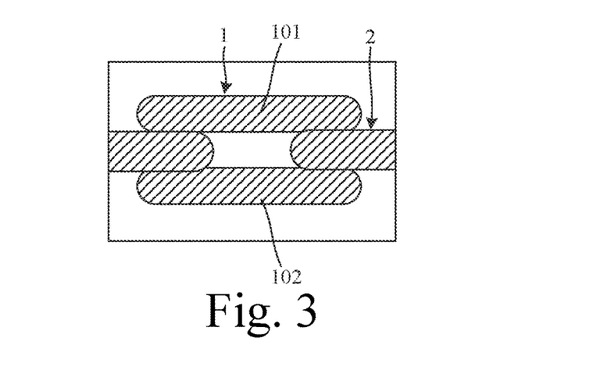
FIG. 3 is a first plan view of dummy structures connected with gate line slits.

As an example, referring to FIG. 3, a first plan view of the dummy structure 1 connected with the gate line slit 2 is shown, wherein the first dummy section 101 and the second dummy section 102 of the dummy structure 1 are disposed independently, and the gap is located between the first dummy section 101 and the second dummy section 102. In the present embodiment, the first dummy section 101 and the second dummy section 102 are disposed in parallel in the direction in which the gate line slit 2 extends, and the first dummy section 101 and the second dummy section 102 are of a straight-line type.

Figure 4:
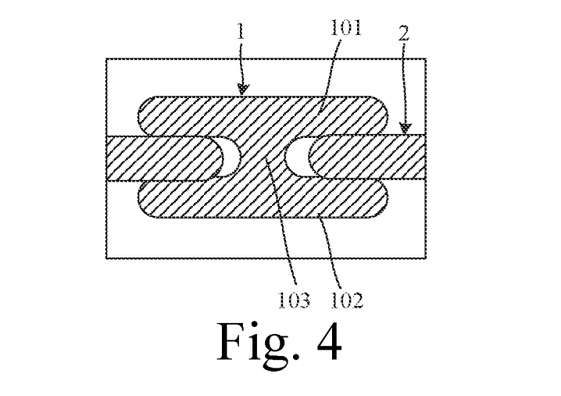
FIG. 4 is a second plan view of dummy structures connected with gate line slits.

As an example, referring to FIG. 4, a second plan view of the dummy structure 1 connected with the gate line slit 2 is shown, wherein the gap is located between the first dummy section 101 and the second dummy section 102, the dummy structure 1 further comprises a third dummy section 103 located in the gap and connected with the first dummy section 101 and the second dummy section 102, and the third dummy section 103 is spaced apart from the gate line slit 2 by a preset distance.

Figure 5:
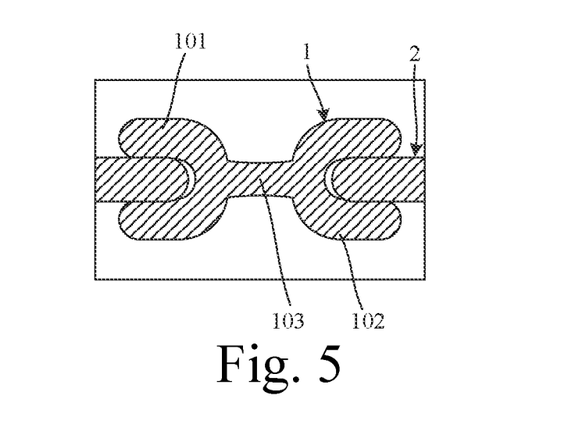
FIG. 5 is a third plan view of dummy structures connected with gate line slits.

As an example, referring to FIG. 5, a third plan view of the dummy structure 1 connected with the gate line slit 2 is shown, wherein the gaps are located respectively in a region enclosed by the first dummy section 101 and a region enclosed by the second dummy section 102, the dummy structure further comprises a third dummy section 103 located between the first dummy section 101 and the second dummy section 102 and connected with the first dummy section 101 and the second dummy section 102 respectively, and the third dummy section 103 is spaced apart from the gate line slit 2 by a preset distance.

Figure 6:
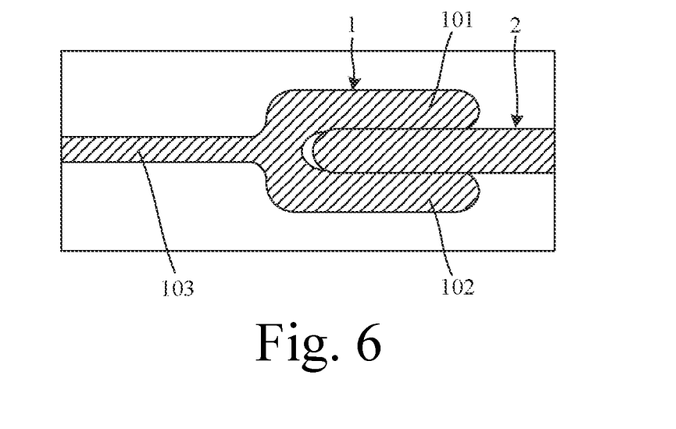
FIG. 6 is a fourth plan view of dummy structures connected with gate line slits.

As an example, referring to FIG. 6, a fourth plan view of the dummy structure 1 connected with the gate line slit 2 is shown, wherein the gap is located between the first dummy section 101 and the second dummy section 102, the first dummy section 101 and the second dummy section 102 of the dummy structure 1 are connected by a third dummy section 103. In particular, the third dummy section 103 is connected with one end of the first dummy section 101 away from the gate line slit 2 and with one end of the second dummy section 102 away from the gate line slit 2, and the third dummy section 103 is spaced apart from the gate line slit 2 by a preset distance.

In the above-described various forms of dummy structures, dummy structures with the forms shown in FIGS. 3, 4 and 5 are more suitable for connection between two gate line slits, and the dummy structure with the form shown in FIG. 6 is more suitable for connecting a single gate line slit.

It is noted that in other embodiments, the dummy structure may further adopt other forms that wrap around an end of a gate line slit, and the above examples should not unduly limit the scope of the present disclosure.

Figure 7:
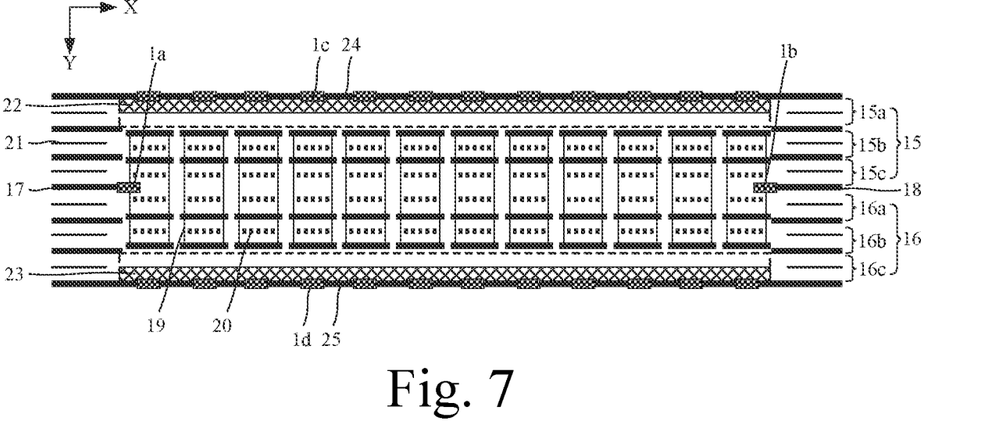
FIG. 7 is a layout plan view of a 3D memory according to the present disclosure.

As an example, referring to FIG. 7, a layout plan view of the 3D memory is shown that comprises a plurality of blocks formed by dividing the stack structure by the gate line slits in a first horizontal direction Y, the blocks comprise a first core region, a step region and a second core region disposed sequentially in a second horizontal direction X, the first horizontal direction Y is perpendicular to the second horizontal direction X, the step region is provided with a step structure 19 as a connection region comprising a plurality of steps, and a plurality of contacts 20 for connecting with gate line layers are provided on the surfaces of the steps.

As an example, the plurality of blocks comprise adjacent first blocks 15 and second blocks 16, the gate line slits comprise a first gate line slit 17 and a second gate line slit 18 located between the first block 15 and the second block 16 and respectively in the first core region and the second core region, the first gate line slit 17 has an end facing the step region and connected with a dummy structure 1a, and the second gate line slit 18 has an end facing the step region and connected with a dummy structure 1b. In the present embodiment, the dummy structure 1a connected with the first gate line slit 17 and the dummy structure 1*b* connected with the second gate line slit 18 both takes the form shown in FIG. 6. The first gate line slit 17, the dummy structure 1*a*, an insulating material (not shown) left after etching a gate line sacrificial layer between the first block 15 and the second block 16, the dummy structure 1*b* and the second gate line slit 18 are connected in turn to realize isolation between the first block 15 and the second block 16.

As an example, the first block 15 and the second block 16 both have a plurality of finger structures such as 2-10 finger structures. In the present embodiment, in the direction in which the first block 15 points to the second block, the first block 15 comprises sequentially a first finger structure 15*a*, a second finger structure 15*b* and a third finger structure 15*c*, the second block 16 comprises sequentially a fourth finger structure 16*a*, a fifth finger structure 16*b* and a sixth finger structure 16*c*, wherein in each block, adjacent finger structures are divided by discontinued arrangement of gate line slits, which are utilized to enable gate line layers of adjacent finger structures to be still connected.

As an example, a top select gate cutout 21 is provided in the middle of a memory region of the finger structure, and the top select gate cutout 21 divides a top select gate layer of the memory region into two parts so as to divide the memory region into two separate programmable (read/write) pages.

As an example, in order to realize enforcement between all blocks, the gate line slit further comprises a plurality of third gate line slits 24 spaced apart from each other on a side of the first block 15 away from the second block 16 and a plurality of fourth gate line slits 25 spaced apart from each other on a side of the second block 16 away from the first block 15, the third gate line slits 24 and the fourth gate line slits 24 are located in the step region, adjacent two of the third gate line slits 24 are connected by a dummy structure 1*c*, and adjacent two of the fourth gate line slits 25 are connected by a dummy structure 1*d*. The dummy structure 1*c* and the dummy structure 1*d* adopt the forms of dummy structure shown in FIGS. 3, 4 and 5.

As an example, a first wall structure 22 is provided in an edge region (in the present embodiment, an edge region of the first finger structure 15*a*) of the first block 15 away from the second block 16, a second wall structure 23 is provided in an edge region (in the present embodiment, an edge region of the sixth finger structure 16*c*) of the second block 16 away from the first block 15, the third gate line slit 1*c* is located on a side of the first wall structure 22 away from the second wall structure 23, the fourth gate line slit 1*d* is located on a side of the second wall structure 23 away from the first wall structure 22, and the first wall structure 22 and the second wall structure 23 both comprise conductive layers (e.g., tungsten layers) and insulating layers (e.g., silicon oxide layers) stacked alternatively in the vertical direction, wherein the first wall structure 22 and the second wall structure 23 are configured for an electrical connection at two ends of a block structure. The cross-sectional areas of the first wall structure 22 and the second wall structure 23 may gradually increase from top to bottom, wherein the dashed box region in the first finger structure 15*a* is shown as the projection region of the first conductive wall 22 onto the horizontal plane which has an area greater than the top areas of the first conductive wall 22, and the dashed box region in the sixth finger structure 16*c* is shown as the projection region of the second conductive wall 23 onto the horizontal plane which has an area greater than the top areas of the second conductive wall 23.

In the 3D memory of the present embodiment, the dummy structure comprises a first dummy section and a second dummy section with a gap provided in between, an end of the gate line slit extends into the gap, at least one of the first dummy section and the second dummy section partially overlaps the projection of the gate line slit onto the horizontal plane to realize connection between the dummy structure and the gate line slit. This dummy structure design, in which the end of gate line slit is wrapped but not completely overlapped, may effectively improve the process window problem of the etching of gate line slit at the boundary between the dummy structure and the gate line slit and effectively reduce/eliminate weak points at the boundary between the dummy structure and the gate line slit, thereby facilitating improvement of device reliability.

Embodiment II

Figure 8:
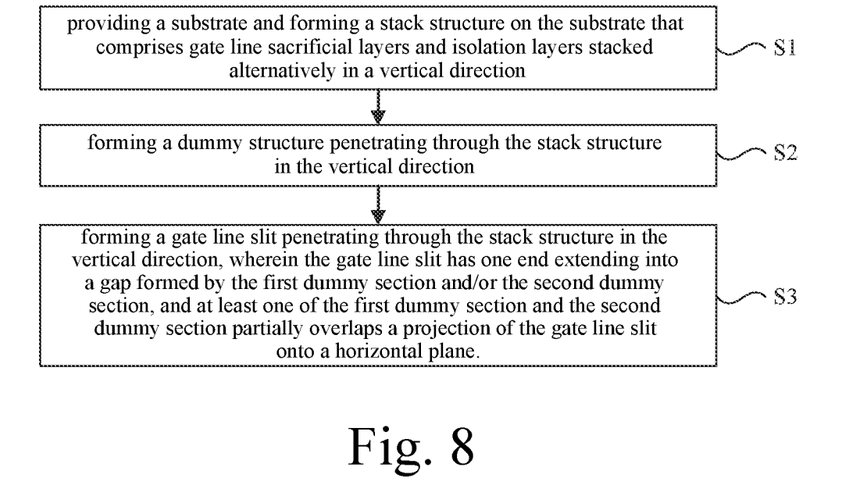
FIG. 8 is a process flow diagram of a manufacturing method for a 3D memory according to the present disclosure.

A manufacturing method of a 3D memory is provided in the present embodiment. Referring to FIG. 8, a process flow diagram of the method is shown, which comprises steps of:
S1: providing a substrate and forming a stack structure on the substrate that comprises gate line sacrificial layers and isolation layers stacked alternatively in a vertical direction;
S2: forming a dummy structure penetrating through the stack structure in the vertical direction and comprising a first dummy section and a second dummy section; and S3: forming a gate line slit penetrating through the stack structure in the vertical direction, wherein the gate line slit has one end extending into a gap formed by the first dummy section and/or the second dummy section, and at least one of the first dummy section and the second dummy section partially overlaps the projection of the gate line slit onto a horizontal plane.

Figure 9:
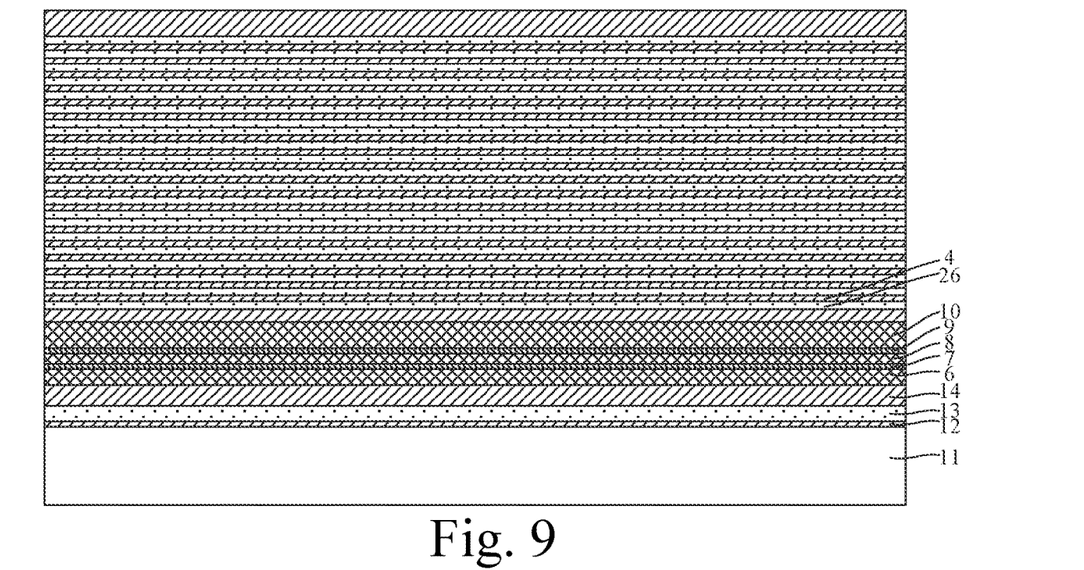
FIG. 9 is a schematic diagram showing forming a stack structure on a substrate in the manufacturing method for the 3D memory according to the present disclosure.

Referring to FIG. 9 first, step S1 is performed: providing a substrate and forming a stack structure on the substrate that comprises gate line sacrificial layers 26 and isolation layers 4 stacked alternatively in the vertical direction. The gate line sacrificial layers 26 comprise, but not limited to silicon nitride layers, and the isolation layers 4 comprise, but not limited to silicon oxide layers. The gate line sacrificial layers are removed in a subsequent process, and gate line material such as tungsten will be filled again to obtain gate lines.

As an example, the substrate comprises sequentially from bottom to top a substrate layer 11, a protective layer 12, a silicon nitride layer 13, a silicon oxide layer 14, a bottom polysilicon layer 6, a first spacer layer 7, a middle polysilicon layer 8, a second spacer layer 9 and a top polysilicon layer 10. The substrate layer 11 comprises, but not limited to Si substrate, Ge substrate, SiGe substrate, silicon on insulator (SOI) substrate or germanium on insulator (GOI) substrate and the substrate layer 11 may be P-doped or N-doped. The protective layer 12 comprises, but not limited to silicon oxide. The first spacer layer 7 or the second spacer layer 9 comprises, but not limited to silicon oxynitride. The middle polysilicon layer 8 serves as a sacrificial layer that will be removed, and a refill will be performed later. It is noted that this is only an example, in other embodiments, structure layers in the substrate may be adjusted as desired, and the example above should not unduly limit the scope of the present disclosure.

Figure 10:
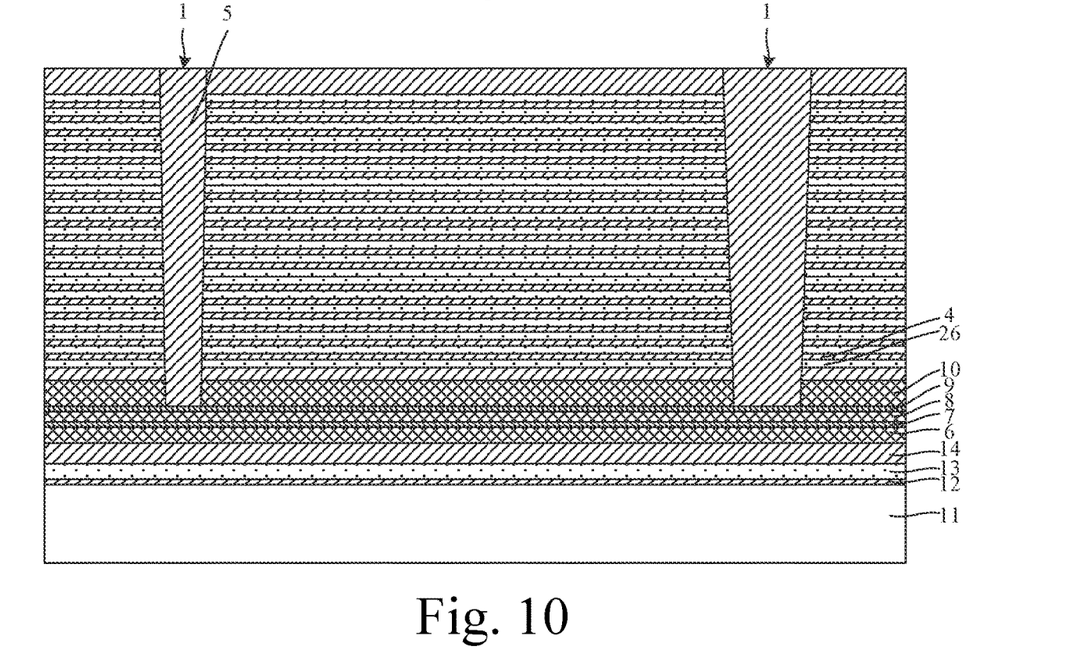
FIG. 10 is a schematic diagram showing forming a dummy structure in the manufacturing method for the 3D memory according to the present disclosure.

Referring to FIG. 10 next, step S2 is performed: forming a dummy structure 1 by one or more wet etching and/or dry etching processes (such as deep reactive ion etching (DRIE)) and filling an insulating material 5 in the dummy structure 1, wherein the dummy structure 1 penetrates through the stack structure in a vertical direction. In the present embodiment, the bottom of the dummy structure 1 reaches the surface of the second spacer layer 9.

Figure 11:
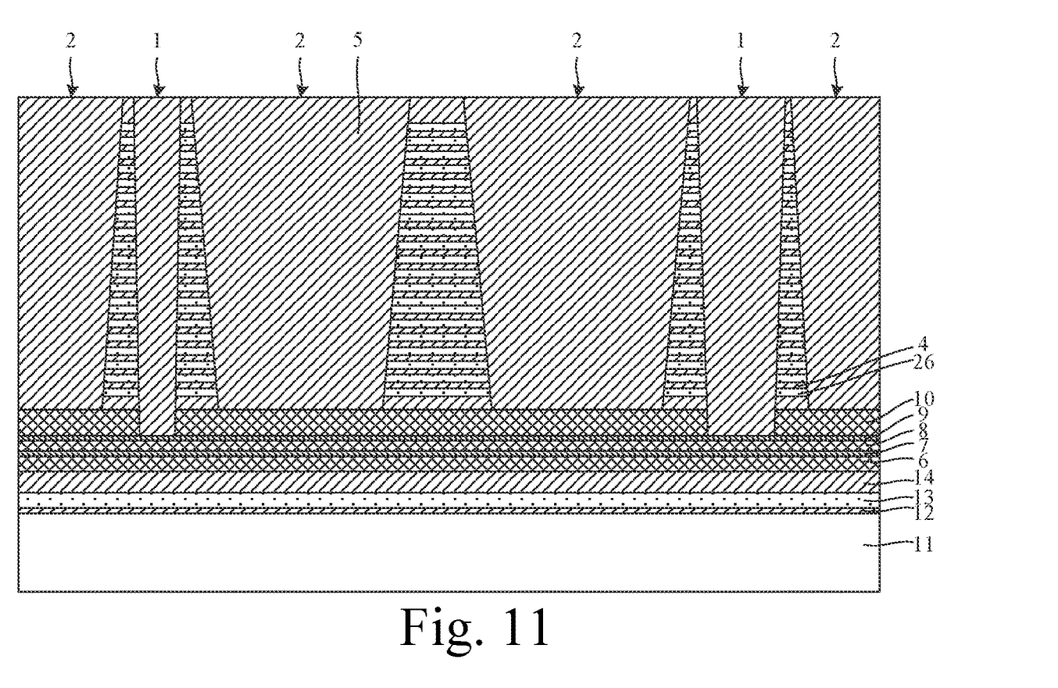
FIG. 11 is a schematic diagram showing forming a gate line slit in the manufacturing method for the 3D memory according to the present disclosure.

Referring next to FIG. 11 next, step S3 is performed: forming a gate line slit 2 by one or more wet etching and/or dry etching processes, wherein the gate line slit 2 penetrates through the stack structure in a vertical direction. In the present embodiment, the bottom of the gate line slit 2 reaches the surface of the top polysilicon layer 10.

Figure 12:
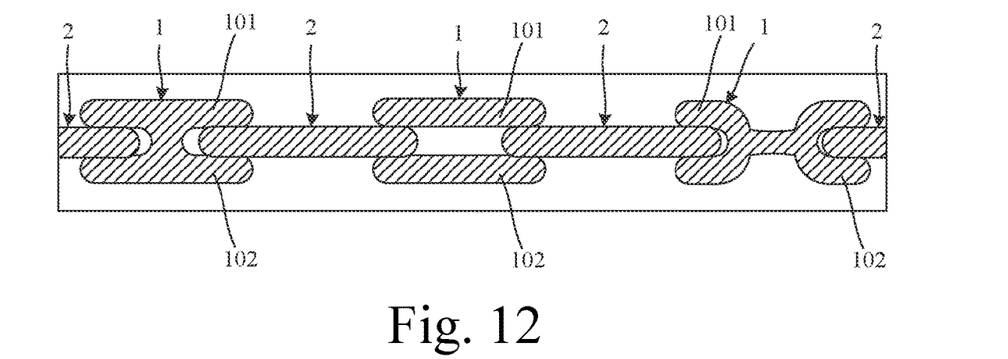
FIG. 12 is a partial top view showing a resultant structure of step S3 in the manufacturing method for the 3D memory according to the present disclosure.

As an example, referring to FIG. 12, a partial top view of the resultant structure of this step is shown. As can be seen, the dummy structure 1 comprises a first dummy section 101 and a second dummy section 102, the gate line slit 2 has one end extending into a gap formed by the first dummy section 101 and/or the second dummy section 102, and at least one of the first dummy section 101 and the second dummy section 102 partially overlaps the projection of the gate line slit 2 onto the horizontal plane.

In particular, the gap formed by the first dummy section 101 and/or the second dummy section 102 has a width smaller than the width of the gate line slit 2 to ensure that the dummy structure 1 and the projection of the gate line slit 2 onto the horizontal plane have overlapping parts, thereby realizing connection between the dummy structure 1 and the gate line slit 2. Ideally, the gate line slit 2 is located right in the middle of the gap formed by the first dummy section 101 and the second dummy section 102, and both the first dummy section 101 and the second dummy section 102 have overlapping parts with the projection of the gate line slit 2 onto the horizontal plane; or the gate line slit 2 is located right in the middle of the gap formed by the first dummy section 101 or the second dummy section 102, and the first dummy section 101 or the second dummy section 102 has overlapping parts with both sides of the gate line slit 2; while in non-ideal situation, the gate line slit 2 is offset from the right middle of the gap, however since the gap width is smaller than that of the gate line slit 2, regardless of which side the gate line slit 2 is offset, it is possible to ensure that the dummy structure 1 and the projection of the gate line slit 2 onto the horizontal plane have overlapping parts.

As an example, in a direction perpendicular to a direction in which the gate line slit 2 extends, the overlapping part of the dummy structure 1 and the projection of the gate line slit 2 onto the horizontal plane has a width of M, and the gate line slit 2 has a width of N, wherein M<0.1N. That is, the width of the overlapping part occupies a very small proportion of the total width of the gate line slit 2, thereby effectively reducing/eliminating weak points at boundaries between the dummy structure 1 and the gate line slit 2 and facilitating device performance.

In particular, the dummy structure 1 may have various forms given that the above-described principles are satisfied.

As an example, referring to FIG. 3, a first plan view of the dummy structure 1 connected with the gate line slit 2 is shown, wherein the first dummy section 101 and the second dummy section 102 of the dummy structure 1 are disposed independently and the gap is located between the first dummy section 101 and the second dummy section 102. In the present embodiment, the first dummy section 101 and the second dummy section 102 are disposed in parallel in the direction in which the gate line slit 2 extends and are of a straight-line type.

As an example, referring to FIG. 4, a second plan view of the dummy structure 1 connected with the gate line slit 2 is shown, wherein the gap is located between the first dummy section 101 and the second dummy section 102, the dummy structure 1 further comprises a third dummy section 103 located in the gap and connected with the first dummy section 101 and the second dummy section 102, and the third dummy section 103 is spaced apart from the gate line slit 2 by a preset distance.

As an example, referring to FIG. 5, a third plan view of the dummy structure 1 connected with the gate line slit 2 is shown, wherein the gaps are located respectively in a region enclosed by the first dummy section 101 and a region enclosed by the second dummy section 102, the dummy structure further comprises a third dummy section 103 located between the first dummy section 101 and the second dummy section 102 and connected with the first dummy section 101 and the second dummy section 102 respectively, and the third dummy section 103 is spaced apart from the gate line slit 2 by a preset distance.

As an example, referring to FIG. 6, a fourth plan view of the dummy structure 1 connected with the gate line slit 2 is shown, wherein the gap is located between the first dummy section 101 and the second dummy section 102, the first dummy section 101 and the second dummy section 102 of the dummy structure 1 are connected by a third dummy section 103. In particular, the third dummy section 103 is connected with one end of the first dummy section 101 away from the gate line slit 2 and with one end of the second dummy section 102 away from the gate line slit 2, and the third dummy section 103 is spaced apart from the gate line slit 2 by a preset distance.

It is noted that FIG. 12 above shows three different forms of dummy structures at the same time. However, in practical applications, same or different forms of dummy structures may be selected flexibly as desired, and the examples above should not unduly limit the scope of the present disclosure. Dummy structures with the forms shown in FIGS. 3, 4 and 5 are more suitable for connection between two gate line slits, and the dummy structure with the form shown in FIG. 6 is more suitable for connecting a single gate line slit.

It is noted that in other embodiments, the dummy structure may further adopt other forms that wrap around an end of gate line slit, and the above examples should not unduly limit the scope of the present disclosure.

In particular, the gate line sacrificial layer may be removed subsequently to obtain lateral grooves and gate line layers may be deposited in the lateral grooves.

In the manufacturing method of 3D memory of the present embodiment, the overlapping area between the dummy structure and the gate line slit is small such that mutual influence is small. Therefore, it is possible to broaden the process window of the etching of gate line slit at the boundary between the dummy structure and the gate line slit and effectively reduce/eliminate weak points at the boundary between the dummy structure and the gate line slit, thereby facilitating improvement of device reliability.

In summary, in the 3D memory of the present embodiment, the dummy structure comprises a first dummy section and a second dummy section with a gap provided in between, an end of the gate line slit extends into the gap, and at least one of the first dummy section and the second dummy section partially overlaps the projection of the gate line slit onto the horizontal plane to realize connection between the dummy structure and the gate line slit. This dummy structure design, in which the end of gate line slit is wrapped but not completely overlapped, may effectively alleviate the process window problem of the etching of gate line slit at the boundary between the dummy structure and the gate line slit and effectively reduce/eliminate weak points at the boundary between the dummy structure and the gate line slit, thereby facilitating improvement of device reliability. The present disclosure may effectively overcome disadvantages with prior art and may have a high industry application value.

The above-described embodiments simply illustrate principles and effects of the present disclosure rather than limiting the present disclosure. Any one skilled in the art may modify or change the above embodiments without departing from the spirit and scope of the present disclosure. Therefore, all equivalent modifications or changes made by those skilled in the art without departing from the spirit and technical concept disclosed in the present disclosure are still encompassed by claims of the present disclosure.

What is claimed is:

1. A three-dimensional memory, comprising:
   a stack structure comprising gate line layers and dielectric layers stacked alternatively in a vertical direction;
   a dummy structure penetrating through the stack structure in the vertical direction and comprising a first dummy section and a second dummy section; and
   a gate line slit penetrating through the stack structure in the vertical direction, wherein the gate line slit has one end extending into at least one gap formed by at least one of the first dummy section or the second dummy section, and the one end is in contact with a portion of the stack structure located in the at least one gap.

2. The three-dimensional memory of claim 1, wherein at least one of the first dummy section and the second dummy section partially over laps a projection of the gate line slit onto a horizontal plane, and
   in a direction perpendicular to a direction in which the gate line slit extends, the overlapping part of the dummy structure and the projection of the gate line slit onto the horizontal plane has a width of M, and the gate line slit has a width of N, where M<0.1N.

3. The three-dimensional memory of claim 1, wherein the first dummy section and the second dummy section are disposed independently, and
   the at least one gap is between the first dummy section and the second dummy section.

4. The three-dimensional memory of claim 3, wherein the first dummy section and the second dummy section are disposed in parallel in a direction in which the gate line slit extends.

5. The three-dimensional memory of claim 1, wherein the at least one gap is located between the first dummy section and the second dummy section,
   the dummy structure further comprises a third dummy section located in the at least one gap and connected with the first dummy section and the second dummy section, and
   the third dummy section is spaced apart from the gate line slit by a preset distance.

6. The three-dimensional memory of claim 1, wherein the at least one gap comprises two gaps located respectively in a region enclosed by the first dummy section and a region enclosed by the second dummy section,
   the dummy structure further comprises a third dummy section located between the first dummy section and the second dummy section and connected with the first dummy section and the second dummy section respectively, and
   the third dummy section is spaced apart from the gate line slit by a preset distance.

7. The three-dimensional memory of claim 1, wherein the at least one gap is located between the first dummy section and the second dummy section,
   the dummy structure further comprises a third dummy section connected with an end of the first dummy section away from the gate line slit and an end of the second dummy section away from the gate line slit, and
   the third dummy section is spaced apart from the gate line slit by a preset distance.

8. The three-dimensional memory of claim 1, wherein the three-dimensional memory comprises a core region and a step region disposed sequentially in a second horizontal direction,
   the gate line slit comprises a first gate line slit in the core region, and
   the first gate line slit has an end facing the step region and connected with one of the dummy structure.

9. The three-dimensional memory of claim 1, wherein the three-dimensional memory comprises a plurality of blocks formed by dividing the stack structure by the gate line slit in a first horizontal direction,
   the blocks comprise a first core region, a step region, and a second core region disposed sequentially in a second horizontal direction,
   and the first horizontal direction is perpendicular to the second horizontal direction.

10. The three-dimensional memory of claim 9, wherein the plurality of blocks comprise adjacent first block and second block,
    the gate line slit comprises a first gate line slit between the first block and the second block and in the first core region,
    the gate line slit comprises a second gate line slit between the first block and the second block and in the second core region,
    the first gate line slit has an end facing the step region and connected with one of the dummy structures, and
    the second gate line slit has an end facing the step region and connected with one of the dummy structures.

11. The three-dimensional memory of claim 10, wherein the at least one gap is located between the first dummy section and the second dummy section,
    the dummy structure further comprises a third dummy section connected with an end of the first dummy section away from the gate line slit and an end of the second dummy section away from the gate line slit, and
    the third dummy section is spaced apart from the gate line slit by a preset distance.

12. The three-dimensional memory of claim 10, wherein the gate line slit comprises a plurality of third gate line slits spaced apart from each other on a side of the first block away from the second block and a plurality of fourth gate line slits spaced apart from each other on a side of the second block away from the first block,
    the third gate line slits and the fourth gate line slits are located in the step region,
    adjacent two of the third gate line slits are connected by the dummy structure, and
    adjacent two of the fourth gate line slits are connected by the dummy structure.

13. The three-dimensional memory of claim 1, wherein the dummy structure comprises an insulating material.

14. The three-dimensional memory of claim 1, wherein a bottom surface of the dummy structure is lower than a bottom surface of the gate line slit.

15. The three-dimensional memory of claim 1, further comprising a polysilicon layer on which the stack structure is disposed, wherein a bottom of the gate line slit extends at least to a surface of the polysilicon layer.

16. A method of manufacturing a three-dimensional memory, comprising:
- forming a stack structure on a substrate, the stack structure comprising gate line sacrificial layers and dielectric layers stacked alternatively in a vertical direction;
- forming a dummy structure penetrating through the stack structure in the vertical direction and comprising a first dummy section and a second dummy section; and
- forming a gate line slit penetrating through the stack structure in the vertical direction, wherein the gate line slit has one end extending into a gap formed by the first dummy section and/or the second dummy section, and the one end is in contact with a portion of stack structure located in the gap.

17. The method of claim 16, wherein
- at least one of the first dummy section and the second dummy section partially overlaps a projection of the gate line slit onto a horizontal plane, and
- in a direction perpendicular to a direction in which the gate line slit extends, the overlapping part of the dummy structure and the projection of the gate line slit onto the horizontal plane has a width of M, and the gate line slit has a width of N, wherein M<0.1N.

18. The method of claim 16, wherein
- the first dummy section and the second dummy section are disposed independently, and
- the gap is between the first dummy section and the second dummy section.

19. The method of claim 18, wherein
- the three-dimensional memory comprises a core region and a step region disposed sequentially in a second horizontal direction,
- the gate line slit comprises a first gate line slit in the core region, and
- the first gate line slit has an end facing the step region and connected with one of the dummy structures.

20. The method of claim 18, wherein
- the three-dimensional memory comprises a plurality of blocks formed by dividing the stack structure by the gate line slit in a first horizontal direction,
- the blocks comprise a first core region, a step region and a second core region disposed sequentially in a second horizontal direction, and
- the first horizontal direction is perpendicular to the second horizontal direction.

* * * * *